United States Patent
Pang

(10) Patent No.: US 9,905,799 B2
(45) Date of Patent: Feb. 27, 2018

(54) DISPLAY SUBSTRATE AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Rui Pang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/310,596

(22) PCT Filed: Mar. 7, 2016

(86) PCT No.: PCT/CN2016/075797
§ 371 (c)(1),
(2) Date: Nov. 11, 2016

(87) PCT Pub. No.: WO2016/188179
PCT Pub. Date: Dec. 1, 2016

(65) Prior Publication Data
US 2017/0194597 A1  Jul. 6, 2017

(30) Foreign Application Priority Data
May 26, 2015  (CN) .......................... 2015 1 0275555

(51) Int. Cl.
*H01L 51/52* (2006.01)
*H01L 23/00* (2006.01)
(Continued)

(52) U.S. Cl.
CPC .......... *H01L 51/5246* (2013.01); *H01L 23/26* (2013.01); *H01L 23/564* (2013.01); *H01L 51/0096* (2013.01); *H01L 51/5259* (2013.01)

(58) Field of Classification Search
CPC ... H01L 23/26; H01L 23/264; H01L 51/5246; H01L 51/5259
See application file for complete search history.

(56) References Cited

U.S. PATENT DOCUMENTS

2003/0209980 A1*  11/2003  Sasatani .............. H01L 51/5259
313/553
2004/0082089 A1*  4/2004  Cheng .................. H01L 51/524
438/26
(Continued)

FOREIGN PATENT DOCUMENTS

WO  2006/100444 A1  9/2006

OTHER PUBLICATIONS

International Search Report and Written Opinion dated Apr. 28, 2016; PCT/CN2016/075797.
(Continued)

Primary Examiner — Bryan Junge
(74) Attorney, Agent, or Firm — Ladas & Parry LLP; Loren K. Thompson

(57) ABSTRACT

A display substrate includes an annular package region and a display region inside package region. The package region includes an annular adhering region and a groove region positioned inside and/or outside the adhering region. A groove structure in which water-absorbing material and/or oxygen-absorbing material is provided is formed in the groove region. The display substrate can solve the problems of poor moisture isolation effect and influence of oxygen in the conventional display device. A display device including the display substrate is further provided.

16 Claims, 2 Drawing Sheets

(51) Int. Cl.
*H01L 51/00* (2006.01)
*H01L 23/26* (2006.01)

(56) References Cited

U.S. PATENT DOCUMENTS

| | | | | |
|---|---|---|---|---|
| 2005/0046344 | A1* | 3/2005 | Lee | H01L 51/524 |
| | | | | 313/504 |
| 2005/0067718 | A1* | 3/2005 | Frischknecht | H01L 23/26 |
| | | | | 257/787 |
| 2005/0248270 | A1* | 11/2005 | Ghosh | H01L 51/524 |
| | | | | 313/512 |
| 2006/0001041 | A1* | 1/2006 | Peng | H01L 51/524 |
| | | | | 257/103 |
| 2007/0013305 | A1* | 1/2007 | Wang | B01J 20/183 |
| | | | | 313/553 |
| 2008/0239637 | A1 | 10/2008 | Sung et al. | |
| 2013/0069105 | A1* | 3/2013 | Shi | H01L 51/524 |
| | | | | 257/100 |
| 2015/0364722 | A1* | 12/2015 | Yang | H01L 51/5246 |
| | | | | 257/40 |

OTHER PUBLICATIONS

The First Chinese Office Action dated Jun. 19, 2017; Appln. No. 201510275555.1.

* cited by examiner

DISPLAY SUBSTRATE AND DISPLAY DEVICE

TECHNICAL FIELD

Embodiments of the present disclosure relate to a display substrate and a display device.

BACKGROUND

Organic Light-Emitting Diode (OLED) has characteristics of complete solid-state, active lumination, high brightness, high contrast, slim and lightweight, low power consumption, no viewing angle limitations, wide operating temperature range and the like, and is considered to be leading technology for the next-generation flat panel display.

A key problem currently suppressing the development of the OLED industry is the life of the OLED device. A lot of tests and analysis shows that the main reason for the failure of the OLED device is the micro-electrolytic cell failure model of the OLED device. Specifically, the OLED device is a device driven by DC current, and if there is moisture inside the device, a micro-electrolytic cell will be formed inside the device and an electrochemical reaction will take place when the OLED is in an operating state. The thus-generated reaction gas will separate the metallic cathode from the organic functional layer which leads to the failure of the device. Moreover, a conventional OLED device usually adopts a metallic cathode of aluminum which is a relatively reactive metal and is susceptive to react with the infiltrated moisture so as to form a dielectric layer having a very large resistance, which is equivalent to connecting a large resistor in series inside the device and affects the brightness of the device. In addition, moisture and oxygen will also react with the organic materials, and such chemical reactions will also lead to the failure of the device. Therefore, research on the packaging of organic light-emitting device is of great significance to improve the efficiency of the device and to prolong the life of the device.

At present, a method for packaging the OLED is to use various types of epoxy resin and/or inorganic material to form a sealed adhesive layer after curing by UV light. Although such a sealing method is usually capable of providing good mechanical strength, it fails to provide sufficient capability of isolating moistures in most environments.

SUMMARY

Embodiments of the present disclosure provide a display panel and a display device, wherein a package structure for the display panel has good effect of moisture insulation and can be manufactured through simple processes.

At least one embodiment of the present disclosure provides a display substrate comprising an annular package region and a display region disposed inside the package region, wherein the package region comprises an annular adhering region and a groove region positioned inside and/or outside the adhering region, the groove region is formed with a groove structure in which water-absorbing material is provided.

At least one embodiment of the present disclosure provides a display device, comprising a first substrate and a second substrate which are cell-assembled, the first substrate and/or the second substrate are/is the display substrate according to the embodiments of the present disclosure.

In the display substrate and the display device according to the embodiments of the present disclosure, the display substrate comprises an annular package region and a display region disposed inside the package region, the package region comprises an annular adhering region and a groove region positioned inside and/or outside the adhering region, the groove region is formed with a groove structure in which water-absorbing material is provided. When the adhering region is irradiated by UV light to cure a resin layer so as to package, the groove structure can receive liquid generated by irradiating the resin layer or inorganic material through UV light and the liquid can be absorbed by the water-absorbing material within the groove structure. After the display substrate is cell-assembled, moisture can be absorbed by the water-absorbing material within the groove structure, so that the cell-assembled display substrate has an improved effect of moisture isolation and the display device has a prolonged life.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

Figure 1:
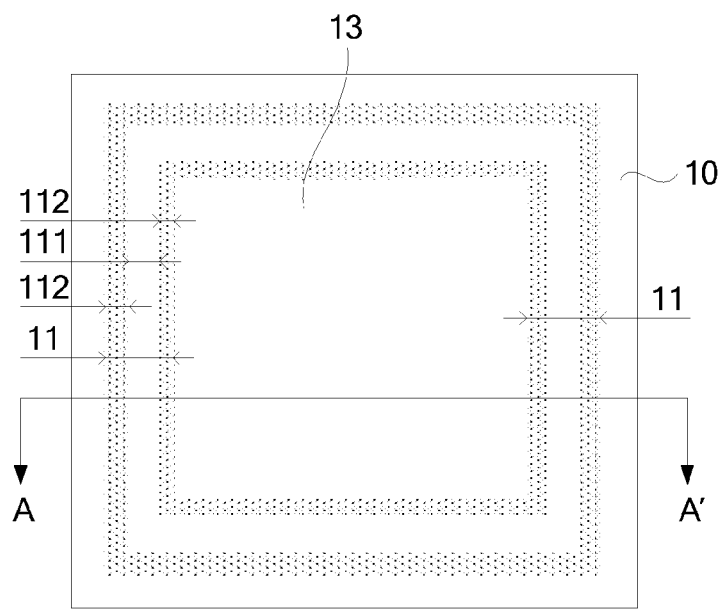
FIG. 1 is an illustrative top view of a structure of a display substrate according to an embodiment of the present disclosure.

| Reference numerals: | |
| --- | --- |
| 10 - display substrate; | 11 - package region; |
| 12 - groove structure; | 13 - display region; |
| 20 - first substrate; | 30 - second substrate; |
| 40 - sealant; | 111 - adhering region; |
| 112 - groove region. | |

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

At least one embodiment of the present disclosure provides a display substrate 10. As illustrated in FIG. 1, the display substrate 10 comprises a plurality of display regions 13 each of which is a pixel or a sub-pixel. An annular package region 11 is disposed around each display region 13. The display region 13 is within the annular package region 11. The package region 11 comprises an annular adhering region 111 and a groove region 112 positioned inside and/or outside the adhering region 111. The groove region 112 is formed with a groove structure 12 in which water-absorbing material is provided.

In one embodiment of the present disclosure, the substrate is a rigid or flexible substrate, and can be a glass substrate, a plastic substrate or a stainless steel substrate and etc.

Figure 2:
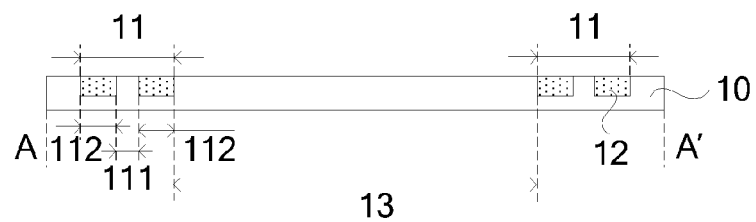
FIG. 2 is an illustrative sectional view of the display substrate of FIG. 1 taken along A-A' direction.

FIG. 2 is an illustrative sectional view of the display substrate 10 according to one embodiment of the present disclosure. The package region 11 comprises an adhering region 111 and groove regions 112 positioned inside and outside the adhering region 111. The groove regions 112 are formed with a groove structure 12 in which water-absorbing material is provided.

Figure 3:
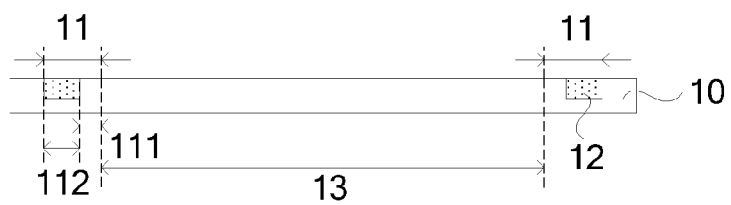
FIG. 3 is an illustrative sectional view of a display substrate according to another embodiment of the present disclosure.

FIG. 3 is an illustrative sectional view of the display substrate 10 according to another embodiment of the present disclosure. The package region 11 comprises an adhering region 111 and a groove region 112 positioned at outside of the adhering region 111. The groove region 112 is formed with a groove structure 12 in which water-absorbing material is provided.

Figure 4:
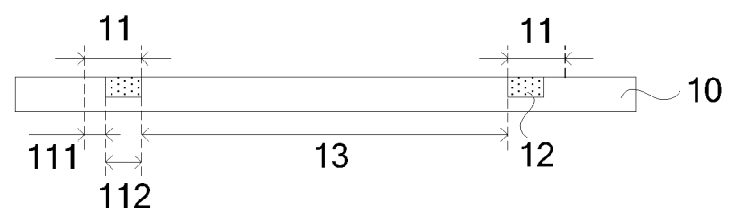
FIG. 4 is an illustrative sectional view of a display substrate according to yet another embodiment of the present disclosure.

FIG. 4 is an illustrative sectional view of the display substrate 10 according to yet another embodiment of the present disclosure. The package region 11 comprises an adhering region 111 and a groove region 112 positioned inside of the adhering region 111. The groove region 112 is formed with a groove structure 12 in which water-absorbing material is provided.

Here, it should be noted that the region positioned inside of the adhering region and the region positioned outside the adhering region can be regions positioned at a distance from the adhering region or can be regions positioned closely adjacent to the adhering region, which is not limited in the embodiments of the present disclosure. The embodiments of the present disclosure are illustrated only by means of examples in the drawings.

The water-absorbing material comprises desiccant and the like. For example, it can be substances of anhydrous calcium chloride, anhydrous magnesium sulfate, and solid sodium hydroxide and the like. The water-absorbing material is not restricted by the embodiments of the present disclosure and is only exampled only by the examples mentioned above.

In one embodiment of the present disclosure, the water-absorbing material is a kind of jelly formed by mixing the desiccant with a first viscous substance and has viscosity. The water-absorbing material is adhered in the groove structure.

The display substrate can be a color filter substrate or an array substrate of a liquid crystal display device. If the display substrate is a color filter substrate or an array substrate of a liquid crystal display device, the inner side of the display substrate is a display region formed by liquid crystals. Alternatively, the display substrate can be a package substrate or an array substrate of an OLED display device. If the display substrate is a package substrate or an array substrate of an OLED display device, the inner side of the display substrate is a display region formed by OLED devices. Of course, the display substrate can be a light emitting substrate formed by OLEDs.

The embodiments of the present disclosure provide a display substrate comprising an annular package region and a display region inside the package region. The package region comprises an annular adhering region and a groove region positioned inside and/or outside the adhering region. The groove region is formed with a groove structure in which water-absorbing material is provided. On one hand, the adhering region is irradiated by UV light to cure a resin layer or inorganic material, and the groove structure can receive liquid generated by irradiating the resin layer or inorganic material through UV light and the liquid can be absorbed by the water-absorbing material within the groove structure when packaging operation is carried out. On the other hand, after the display substrate is cell-assembled, moisture can be absorbed by the water-absorbing material within the groove structure, so that the cell-assembled display substrate has an improved effect of moisture isolation and the display device has a prolonged life.

In one embodiment of the present disclosure, oxygen-absorbing material is further provided in the groove structure. For example, the oxygen-absorbing material comprises sodium or nano composite material. In another embodiment of the present disclosure, the oxygen-absorbing material can be a kind of jelly formed by mixing sodium or nano composite material with a second viscous substance and has viscosity. The oxygen-absorbing material is adhered in the groove structure. Of course, water-absorbing material and oxygen-absorbing material can be provided in the groove structure. Thus, the materials within the groove structure can further absorb oxygen so as to prevent display components in the display region from being oxidized.

In one embodiment of the present disclosure, the water-absorbing material and the oxygen-absorbing material are separately adhered in the groove structure. In another embodiment of the present disclosure, the water-absorbing material and the oxygen-absorbing material are mixed and adhered in the groove structure. For example, desiccant and sodium or nano composite material can be mixed with the first viscous substance and the second viscous substance respectively to form a kind of jelly having viscosity so as to facilitate adhering in the groove structure. Of course, water-absorbing material and/or oxygen-absorbing material can be filled in the groove structure and then can be packaged in the groove structure through a membrane so as to prevent the water-absorbing material and/or oxygen-absorbing material from being diffused. A semipermeable membrane which allows moisture and oxygen to pass through without allowing passage of water-absorbing material and oxygen-absorbing material can be used as the membrane. Other membrane can be used, as long as water-absorbing material and oxygen-absorbing material can be packaged in the groove structure without being diffused while allowing moisture and oxygen to pass through.

The viscous substance in the embodiments of the present disclosure can be OLED packaging sealant such as UV sealant.

Figure 5:
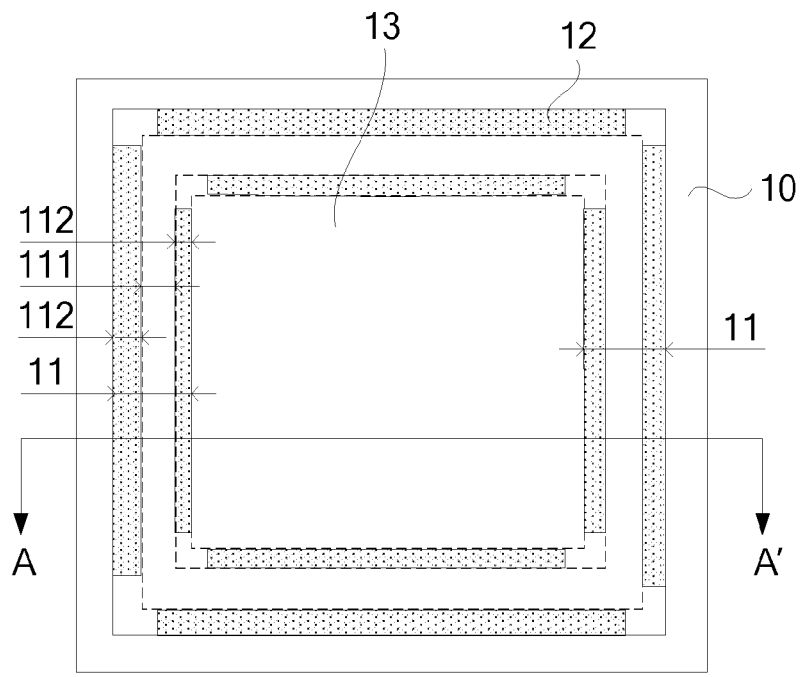
FIG. 5 is an illustrative top view of a structure of a display substrate according to still another embodiment of the present disclosure.

In one embodiment of the present disclosure, the groove structure is an annular groove formed along a border of the adhering region. As illustrated in FIG. 1, the adhering region 111 is annular and the groove region 112 positioned inside and outside the adhering region 111 is annular, and thus the groove structure 12 can be an annular groove in the groove region 112. Of course, an example of the groove structure being in the groove region can be that illustrated in FIG. 5, in which the groove region 112 is annular and the groove structure 12 is at an arbitrary position in the groove region 112. The structure as illustrated in FIG. 5 is only taken as an example of the embodiments of the present disclosure.

Of course, the shape and arrangement of the groove structure in the groove region are not restricted by the embodiments of the present disclosure. Description is only made by taking that are illustrated in FIG. 1 and FIG. 5 as example.

Figure 6:
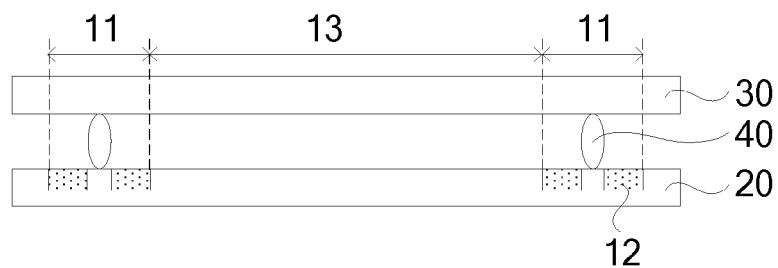
FIG. 6 is an illustrative view of a display device according to an embodiment of the present disclosure.

Further, in case that the package region comprises groove regions positioned inside the adhering region and outside the adhering region, the groove region positioned inside the adhering region has a width smaller than that of the groove region positioned outside the adhering region. As illustrated in FIG. 6, groove regions are provided both inside and outside the adhering region. Since a display region is provided inside the adhering region, the groove region positioned inside the adhering region is made to have a width smaller than that of the groove region positioned outside the adhering region so that area of the display region will not be reduced.

Figure 7:
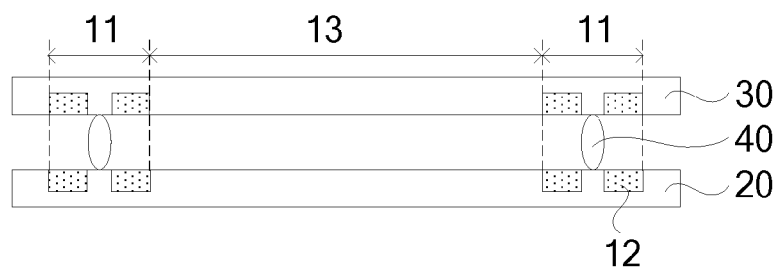
FIG. 7 is an illustrative view of a display device according to another embodiment of the present disclosure.

Embodiments of the present disclosure further provide a display device. As illustrated in FIG. 6 and FIG. 7, the display device comprises a first substrate 20 and a second substrate 30 which are cell-assemble. The first substrate and/or the second substrate are/is any one of the display substrates according to the embodiments of the present disclosure.

In the cell-assembled first substrate 20 and second substrate 30 of the display device as illustrated in FIG. 6, the first substrate 20 comprises an annular package region 11 and a display region 13 at the inner side of the package region 11. Taking the display substrate as illustrated in FIG. 2 as an example of the first substrate 20, the package region 11 comprises an annular adhering region 111 in which sealant 40 is formed and a groove region 112 positioned inside and outside the adhering region 111. The groove region 112 is formed with a groove structure 12 in which water-absorbing material is provided. Of course, the first substrate 20 can be the display substrates as illustrated in FIG. 3 and FIG. 4, or the second substrate can be the display substrate as illustrated in any one of FIG. 2 to FIG. 4.

In the cell-assembled first substrate 20 and second substrate 30 of the display device as illustrated in FIG. 7, the first substrate 20 and the second substrate 30 each comprises an annular package region 11 and a display region 13 at the inner side of the package region 11. Taking the display substrate as illustrated in FIG. 2 as an example of the first substrate 20 and of the second substrate 30, the package region 11 comprises an annular adhering region 111 in which sealant 40 is formed and groove regions 112 positioned inside and outside the border of the adhering region 111. The groove region 112 each is formed with a groove structure 12 in which water-absorbing material is provided. Of course, the first substrate 20 and the second substrate 30 can be any one of the display substrates as illustrated in FIG. 2 to FIG. 4.

It should be noted that in the display devices as illustrated in FIG. 6 and FIG. 7, when cell-assembling, a resin layer is firstly coated in the adhering region of the first substrate or the second substrate and the first substrate and the second substrate is adhered to each other by the resin layer in the adhering region. And then, the resin layer is irradiated by UV light and cured. Thus, packaging of the OLED display device is completed. As the resin is heated when being irradiated by UV light, flowing liquid will be generated. The water-absorbing substance in the groove structure can absorb the liquid so as to prevent any damage caused by the flowing of the liquid, such as short circuit of display components in the display region due to entrance of the liquid into the display region.

In one embodiment of the present disclosure, the display device is an OLED display device, the first substrate is an array substrate and the second substrate is a package substrate. Since moisture is a main factor affecting the life of the OLED display device, an effect on moisture isolation of the OLED display device can be improved by the display substrates according to the embodiments of the present disclosure and thus the life of the OLED display device can be further improved.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510275555.1 filed on May 26, 2015, the disclosure of which is hereby entirely incorporated by reference as a part of the present disclosure

The invention claimed is:

1. A display substrate comprising an annular package region positioned at the outside of each display region, wherein the package region comprises an annular adhering region and groove regions positioned inside and outside the adhering region, the groove regions are formed with a groove structure in which water-absorbing material and/or oxygen-absorbing material is provided,
   wherein in case that the package region comprises groove regions positioned inside and outside the adhering region, the groove region positioned inside the adhering region has a width smaller than that of the groove region positioned outside the adhering region.

2. The display substrate according to claim 1, wherein the water-absorbing material is adhered in the groove structure; and/or the oxygen-absorbing material is adhered in the groove structure.

3. The display substrate according to claim 2, wherein the oxygen-absorbing material comprises sodium or nano composite material.

4. The display substrate according to claim 2, wherein the groove structure is an annular groove formed along an edge of the adhering region.

5. The display substrate according to claim 2, wherein the water-absorbing material comprises a desiccant.

6. The display substrate according to claim 1, wherein the groove structure is an annular groove formed along an edge of the adhering region.

7. The display substrate according to claim 6, wherein the oxygen-absorbing material comprises sodium or nano composite material.

8. The display substrate according to claim 1, wherein the water-absorbing material comprises a desiccant.

9. The display substrate according to claim 1, wherein the water-absorbing material is a kind of jelly formed by mixing a desiccant and a first viscous material; the oxygen-absorbing material is a kind of jelly formed by mixing sodium or nano composite material and a second viscous material.

10. The display substrate according to claim 9, wherein the water-absorbing material and the oxygen-absorbing material are mixed into gelatinous form.

11. The display substrate according to claim 9, wherein each of the first viscous material and the second viscous material is OLED sealant.

12. The display substrate according to claim 9, wherein each of the first viscous material and the second viscous material is UV glue.

13. The display substrate according to claim 1, wherein the water-absorbing material and/or the oxygen-absorbing material are/is filled and packaged in the groove structure.

14. The display substrate according to claim 13, wherein the water-absorbing material and/or the oxygen-absorbing material are/is packaged in the groove structure by a semi-permeable membrane.

15. A display device comprising a first substrate and a second substrate which are cell-assembled, the first substrate and/or the second substrate are/is the display substrate according to claim 1.

16. The display device according to claim 15, wherein the display device is an OLED display device, the first substrate is an array substrate, and the second substrate is a package substrate.

* * * * *